(12) United States Patent
Daly et al.

(10) Patent No.: US 8,631,858 B2
(45) Date of Patent: Jan. 21, 2014

(54) SELF COOLING HEAT EXCHANGER WITH CHANNELS HAVING AN EXPANSION DEVICE

(75) Inventors: Phillip F. Daly, Palatine, IL (US); Kurt M. Vanden Bussche, Lake in the Hills, IL (US)

(73) Assignee: UOP LLC, Des Plaines, IL (US)

(*) Notice: Subject to any disclaimer, the term of this patent is extended or adjusted under 35 U.S.C. 154(b) by 368 days.

(21) Appl. No.: 12/485,284

(22) Filed: Jun. 16, 2009

(65) Prior Publication Data

US 2010/0314085 A1 Dec. 16, 2010

(51) Int. Cl.
*F28F 13/00* (2006.01)
*F28F 3/14* (2006.01)

(52) U.S. Cl.
USPC .......................................... 165/135; 165/170

(58) Field of Classification Search
USPC .................................................. 165/135, 170
See application file for complete search history.

(56) References Cited

U.S. PATENT DOCUMENTS

| | | | |
|---|---|---|---|
| 2,310,234 A * | 2/1943 | Haug | 165/160 |
| 4,093,024 A * | 6/1978 | Middleton | 165/170 |
| 4,336,770 A | 6/1982 | Kaneko | |
| 4,488,134 A | 12/1984 | Pfeiffer | |
| 4,607,689 A * | 8/1986 | Mochida et al. | 165/110 |
| 4,890,670 A | 1/1990 | Schiessl | |
| 5,531,266 A * | 7/1996 | Ragi et al. | 165/115 |
| 5,826,646 A | 10/1998 | Bae | |
| 6,062,300 A | 5/2000 | Wang | |
| 6,270,342 B1 * | 8/2001 | Neuberger et al. | 433/29 |
| 6,367,286 B1 | 4/2002 | Price | |
| 6,564,578 B1 | 5/2003 | Fischer-Calderon | |
| 6,742,358 B2 | 6/2004 | Wilkinson | |
| 6,763,680 B2 | 7/2004 | Fischer | |
| 6,886,362 B2 | 5/2005 | Wilding | |
| 6,959,492 B1 * | 11/2005 | Matsumoto et al. | 29/890.039 |
| 7,198,037 B2 | 4/2007 | Sayers | |
| 7,637,112 B2 * | 12/2009 | Vanden Bussche et al. | 62/50.2 |
| 7,866,379 B2 * | 1/2011 | Murayama et al. | 165/166 |
| 8,118,086 B2 * | 2/2012 | Daly et al. | 165/170 |
| 8,122,946 B2 * | 2/2012 | Daly et al. | 165/135 |
| 2003/0015310 A1 * | 1/2003 | Dienhart et al. | 165/41 |
| 2003/0141043 A1 | 7/2003 | Warburton | |
| 2006/0108100 A1 * | 5/2006 | Goldman et al. | 165/80.4 |
| 2006/0137855 A1 | 6/2006 | Daffron | |
| 2007/0028627 A1 * | 2/2007 | Moracchioli et al. | 62/50.2 |
| 2008/0066494 A1 * | 3/2008 | Howard | 62/639 |
| 2008/0142204 A1 * | 6/2008 | Vanden Bussche et al. | 165/167 |

(Continued)

FOREIGN PATENT DOCUMENTS

JP 2002518661 A 6/2002

OTHER PUBLICATIONS

International Preliminary Report on Patentability dated Dec. 29, 2011 for PCT/US2010/038457.

(Continued)

*Primary Examiner* — Brandon M Rosati
(74) *Attorney, Agent, or Firm* — Mark R Willis

(57) ABSTRACT

An inexpensive heat exchanger is disclosed, wherein the heat exchanger is made up of a plurality of plates and each plate has at least one channel defined in the plate. The plates are stacked and bonded together to form a block having conduits for carrying at least one fluid and where the exchanger includes an expansion device enclosed within the unit.

12 Claims, 4 Drawing Sheets

(56) References Cited

U.S. PATENT DOCUMENTS

| | | | |
|---|---|---|---|
| 2010/0314086 A1* | 12/2010 | Daly et al. | 165/168 |
| 2010/0314087 A1* | 12/2010 | Daly et al. | 165/168 |
| 2012/0145366 A1* | 6/2012 | Daly et al. | 165/135 |
| 2012/0145369 A1 | 6/2012 | Daly | |

OTHER PUBLICATIONS

Election/Restriction dated Sep. 10, 2010 for U.S. Appl. No. 12/485,301.
Applicant Request for Reconsideration dated Oct. 11, 2010 for U.S. Appl. No. 12/485,301.
Office Action dated Nov. 12, 2010 for U.S. Appl. No. 12/485,301.
Applicant Request for Reconsideration dated Feb. 14, 2011 for U.S. Appl. No. 12/485,301.
Final Office Action dated Apr. 28, 2011 for U.S. Appl. No. 12/485,301.
Applicant Amendment Accompanying a Request for Continued Examination dated Jul. 22, 2011 for U.S. Appl. No. 12/485,301.
Notice of Allowance dated Oct. 18, 2011 for U.S. Appl. No. 12/485,301.
Election/Restriction dated Sep. 10, 2010 for U.S. Appl. No. 12/485,311.
Applicant Request for Reconsideration of Restriction dated Oct. 11, 2010 for U.S. Appl. No. 12/485,311.
Office Action dated Dec. 23, 2010 for U.S. Appl. No. 12/485,311.
Applicant Amendment After Non-Final Rejection dated Mar. 22, 2011 for U.S. Appl. No. 12/485,311.
Final Office Action dated Jun. 6, 2011 for U.S. Appl. No. 12/485,311.
Applicant Amendment Accompanying a Request for Continued Examination dated Sep. 2, 2011.
Notice of Allowance dated Oct. 31, 2011 for U.S. Appl. No. 12/485,311.
Office Action dated Mar. 28, 2013 for U.S. Appl. No. 13/397,726.
Election/Restriction dated Mar. 14, 2013 for U.S. Appl. No. 13/397,716.
Applicant Response to Restriction Requirement dated Apr. 9, 2013 for U.S. Appl. No. 13/397,716.

\* cited by examiner

SELF COOLING HEAT EXCHANGER WITH CHANNELS HAVING AN EXPANSION DEVICE

FIELD OF THE INVENTION

The present invention relates to the cooling of fluids through the self-cooling from the fluid. More particularly this invention goes to the cooling of a fluid to self-cool the fluid and to cool and, potentially, liquefy another fluid.

BACKGROUND OF THE INVENTION

The demands for natural gas have increased in recent years. The transport of natural gas is through pipelines or through the transportation on ships. Many areas where natural gas is located are remote in the sense that there are no convenient pipelines to readily transfer the natural gas to the market. Therefore natural gas is frequently transported by ship. The transport of natural gas on ships requires a means to reduce the volume and one method of reducing the volume is to liquefy the natural gas. The process of liquefaction requires cooling the gas to very low temperatures. There are several known methods of liquefying natural gas as can be found in U.S. Pat. No. 6,367,286; U.S. Pat. No. 6,564,578; U.S. Pat. No. 6,742,358; U.S. Pat. No. 6,763,680; and U.S. Pat. No. 6,886,362.

One of the methods is a cascade method using a number of shell and tube heat exchangers. Each of these shell and tube heat exchangers is very large and very expensive, and presents problems of economics and feasibility for remote and smaller natural gas fields. It would be desirable to have a device for liquefying natural gas that is compact and relatively inexpensive to ship and use in remote locations, especially for natural gas fields found under the ocean floor, where collection and liquefaction of the natural gas can be performed on board a floating platform using a compact unit.

There is also an increasing demand for methods of cooling gases to condense them for transport or for separation purposes.

BRIEF SUMMARY OF THE INVENTION

The present invention comprises a heat exchanger made up of one or more plates where each plate has at least one channel etched, or milled, or otherwise formed in the plate. The channels each have an inlet and an outlet for admitting and withdrawing a cooling fluid, or refrigerant. The channels each have an expansion device positioned within the channel, where the cooling fluid is expanded and provides self-cooling for the cooling fluid. The plates in the heat exchanger are bonded to form a cooling block, and can be used as a heat sink for devices external to the heat exchanger. In one embodiment, the heat exchanger can provide cooling for a second fluid where the plate includes a second channel formed in the plate. The second channel includes a second inlet and outlet for admitting and withdrawing a cooled fluid. The positioning of the expansion device provides for improved efficiency in the heat exchanger by allowing a better flow distribution of the refrigerant in the channels.

Other objects, advantages and applications of the present invention will become apparent to those skilled in the art from the following detailed description and drawings.

DETAILED DESCRIPTION OF THE INVENTION

The use of liquefied natural gas (LNG) is increasing, as fuel and a means of transporting natural gas from remote sites having natural gas, without a nearby gas pipeline, to more distant areas where the natural gas is consumed. Natural gas is typically recovered from gas wells that have been drilled and is in the gas phase at high pressure. The high pressure gas is then treated and passed to a pipeline for transport. However, there are an increasing number of natural gas fields that are in remote locations relative to natural gas pipelines. The present invention is directed to a heat exchanger for cooling the natural gas at the gas wells. By providing an inexpensive heat exchanger for cooling and liquefying natural gas in remote locations, natural gas can be recovered on site and transported as LNG, rather than requiring a natural gas pipeline, or transporting the gas at very high pressures. In addition, the present invention can be used as a means for cooling other materials, such as providing for a cooling device to cool electronics or other devices that generate heat and need external cooling.

In a first embodiment, the invention comprises a heat exchanger that is fabricated from plates that are bonded together to form an integral unit. The plates have channels etched, milled, pressed, stamped, inflated, or by other methods known in the art, into them for the transport of coolant and fluid to be cooled. When the plates are bonded together, the channels are covered and form conduits through which fluids can flow. The bonding method will depend on the materials of construction, such as with aluminum plates, bonding involves brazing the aluminum plates together. With steel, diffusion bonding or welding can be performed to bond the steel plates together. Other means of bonding plates are known to those skilled in the art.

The most common commercial design of a heat exchanger for the cooling of natural gas is a spiral wound heat exchanger where the coolant cascades within a shell over spiral wound tubes carrying the gas to be cooled. Benefits of the present design over the spiral wound design include lower cost, lower weight, and a more compact structure as well as improved heat transfer characteristics under conditions of motion, as are expected when the heat exchanger is used on board a floating platform or vessel.

Figure 1:
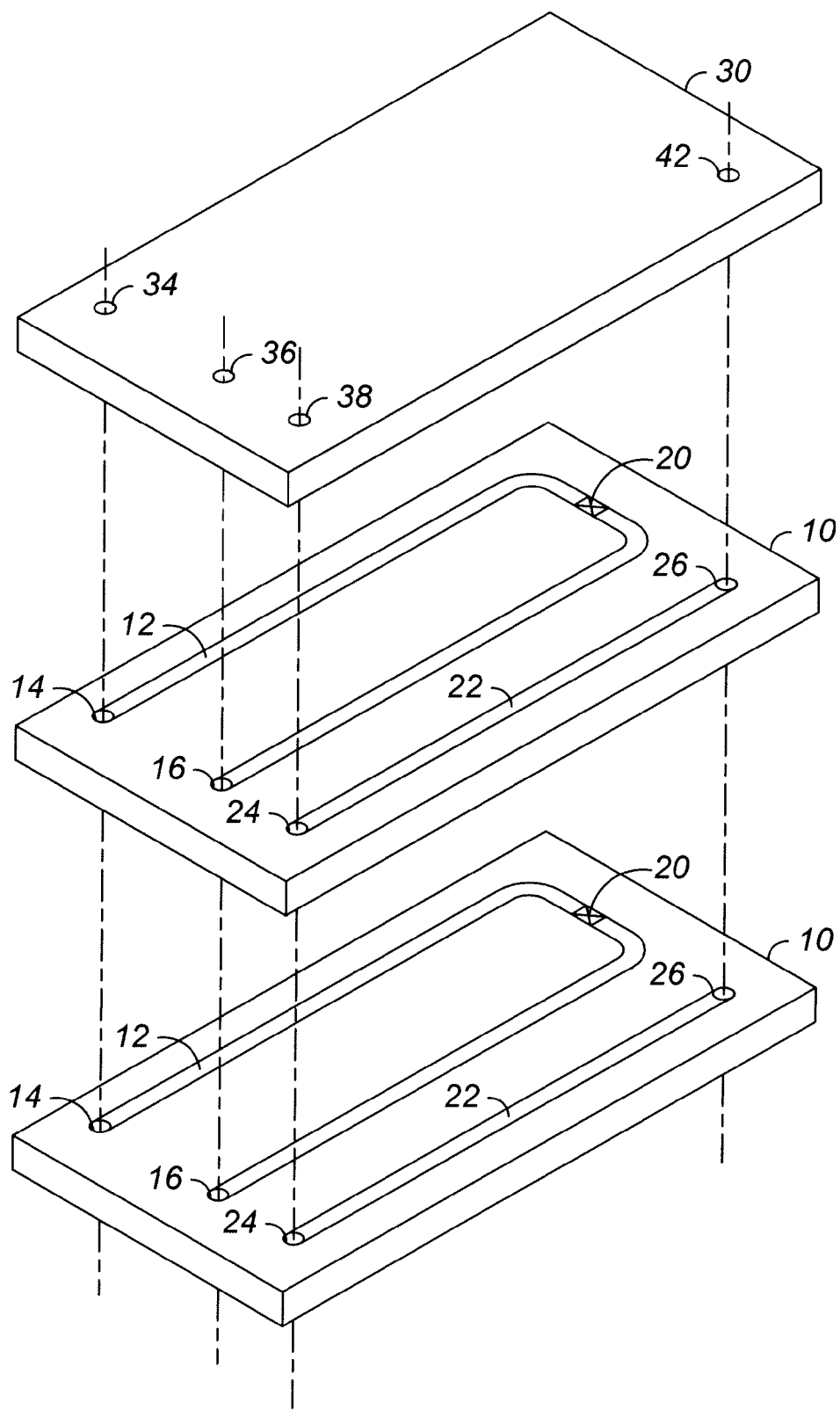
FIG. 1 is a schematic of a first embodiment of the heat exchanger.

As shown in FIG. 1, the heat exchanger comprises at least one plate 10 having a first channel 12 defined therein. The first channel 12 has an inlet 14 and an outlet 16. The plate 10 also has a second channel 22 defined therein, where the second channel 22 has an inlet 24 and an outlet 26 with the first 12 and second 22 channels in fluid isolation. The first channel 12 includes an expansion device 20 disposed within the channel 12. The heat exchanger further includes a cover plate 30. The cover plate 30 has a first channel inlet port 34 in fluid communication with the first channel inlet 14, and a first channel outlet port 36 in fluid communication with the first channel outlet 16. The cover plate 30 also includes a second channel inlet port 38 in fluid communication with the second channel inlet 24, and a second channel outlet port 42 in fluid communication with the second channel outlet 26.

The heat exchanger can comprise a plurality of first plates 10, where the plates 10 are stacked and bonded together. The inlets 14 for the first channels 12 are all in fluid communication with the cover plate first channel inlet port 34, and the outlets 16 for the first channels 12 are all in fluid communication with the cover plate first channel outlet port 36. Similarly, the inlets 24 for the second channels 22 are all in fluid communication with the cover plate second channel inlet port 38, and the outlets 26 for the second channels 22 are all in fluid communication with the cover plate second channel outlet port 42. One method for this fluid communication is for each of the inlets 14, 24 and each of the outlets 16, 26 to pass through the plates 10 and be aligned when the plates 10 are stacked and bonded. The inlets 14, 24 and the outlets 16, 26 on the bottom most plate of the stack would be the only inlets and outlets that do not pass through the last plate in the heat exchanger stack.

The positioning of the expansion device 20 within the channel provides better flow distribution of the cooling fluid. The flow is completely contained within the heat exchanger, which is of particular importance when the cooling fluid provides for two phase flow after expansion and multiple channels or plates in parallel. Conventionally, the expanded fluid is passed to a chamber, where the liquid can separate from the vapor, upon which liquid and vapor are separately re-introduced into the channel. The present invention avoids this separation, overcoming the inefficiencies associated with uneven distribution of the gas and liquid during re-introduction. This advantage is particularly prominent in cases where the device is operating while in motion, as on board a ship, as the separation of gas and liquid in a chamber becomes more difficult to accomplish under those conditions. In addition, no header is needed and no additional equipment is added outside the heat exchanger. An additional advantage is the removal of the need for a pressure test, as is required with an expansion device outside of the heat exchanger. Furthermore, in cases where the heat exchanger is used in cryogenic service, the absence of external welds may avoid the need for a nitrogen sweep of the cold box in which the heat exchanger is disposed, further reducing the cost of the operation.

The expansion device 20 can be chosen according to the proposed design purpose of the heat exchanger, and according to the cooling fluid, or coolant, selected. In one embodiment, the expansion device 20 comprises a restriction in the channel 12 to produce a desired pressure drop and allow the fluid to expand, or flash. Another expansion device 20 includes a Joule-Thomson valve. One example of a Joule-Thomson valve is a conically shaped valve that fits onto a circular seat. The valve is positioned in the channel such that when opened, a gap is created between the conical section and the circular seat. Control of the amount of expansion is regulated by the size of the gap created in opening the valve. For the embodiment comprising multiple plates, the Joule Thomson valve can comprise multiple valves linked through a common drive shaft for closing and opening the valves.

In another embodiment, the expansion device 20 comprises a micro-turbine. The micro-turbine can be used to recover energy from the expansion of the cooling fluid. The amount of energy recovered, or conversely, the level of expansion attained, can be controlled by means of variable resistance applied to the drive shaft of the turbine, such that the device operates according to the cooling demand required.

Figure 2:
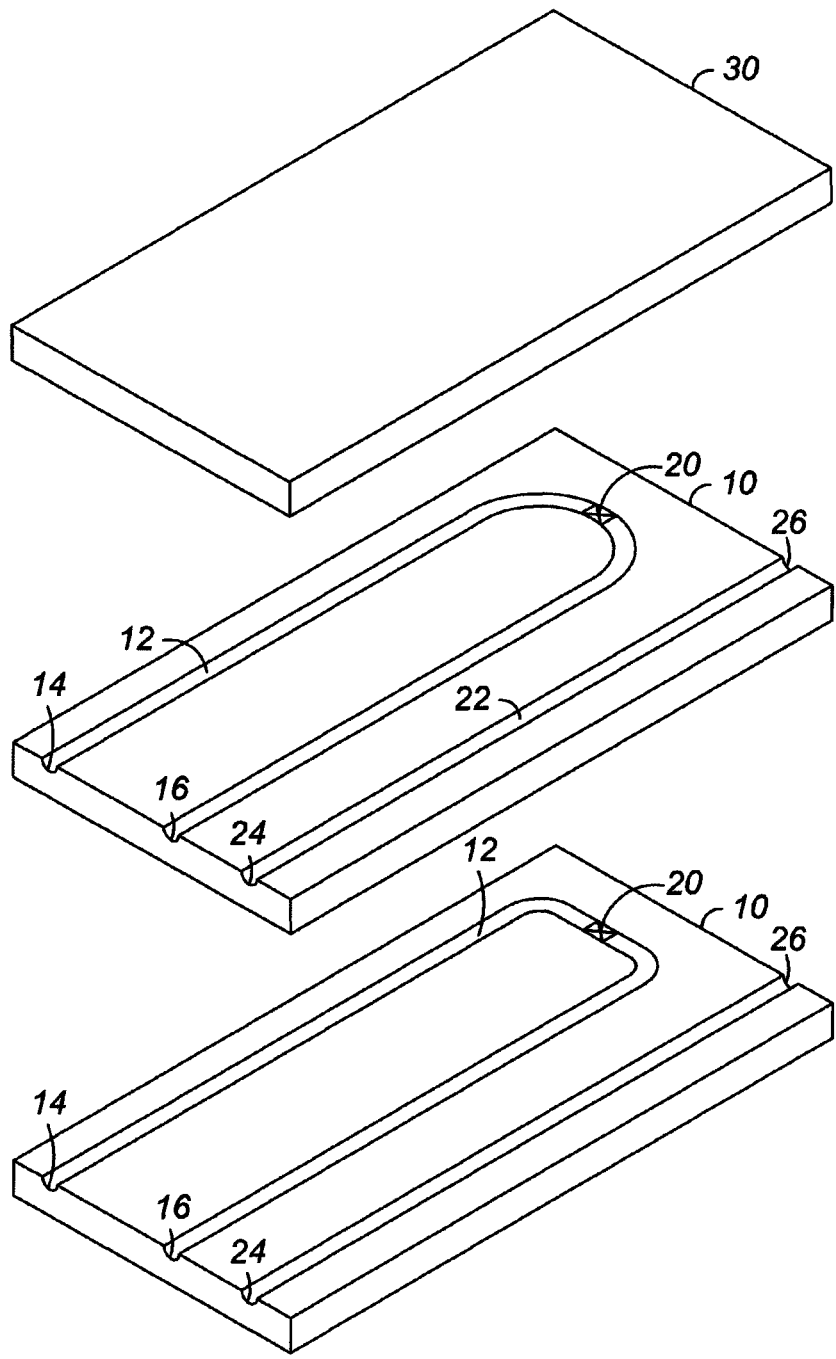
FIG. 2 is a schematic of a second embodiment of the heat exchanger wherein the fluids enter and leave through an edge of the plates.

In a second embodiment, as shown in FIG. 2, the heat exchanger includes at least one plate 10 having a first channel 12 defined therein. The first channel 12 includes an inlet 14 and an outlet 16, and an expansion device 20 disposed within the first channel 12. The heat exchanger includes a cover plate 30 which encloses the channels 12 to form covered channels. The heat exchanger can also include a second channel 22 disposed therein. The second channel 22 includes an inlet 24 and an outlet 26, and is in fluid isolation from the first channel 12. In the second embodiment, the inlets 14, 24 and outlets 16, 26 are positioned at an edge of the plate 10. The positioning allows for the use of a manifold to connect the inlets 14 of the plurality of first channel inlets 14 with a single distribution channel in the manifold. Likewise, this is done for the outlets 16 of the first channel 12, and the inlets 24 and outlets 26 of the second channels 22. The first channel inlets 14 are in fluid communication with a manifold first inlet channel, the first channel outlets 16 are in fluid communication with a manifold first outlet channel, the second channel inlets 24 are in fluid communication with a manifold second inlet channel, and the second channel outlets 26 are in fluid communication with a manifold second outlet channel. An alternate design includes multiple manifolds, especially where the inlets and outlets of a channel are on different edges of the plate 10. An individual manifold with multiple channels can be used, or multiple manifolds with one or more channels in each manifold can be used.

Figure 3:
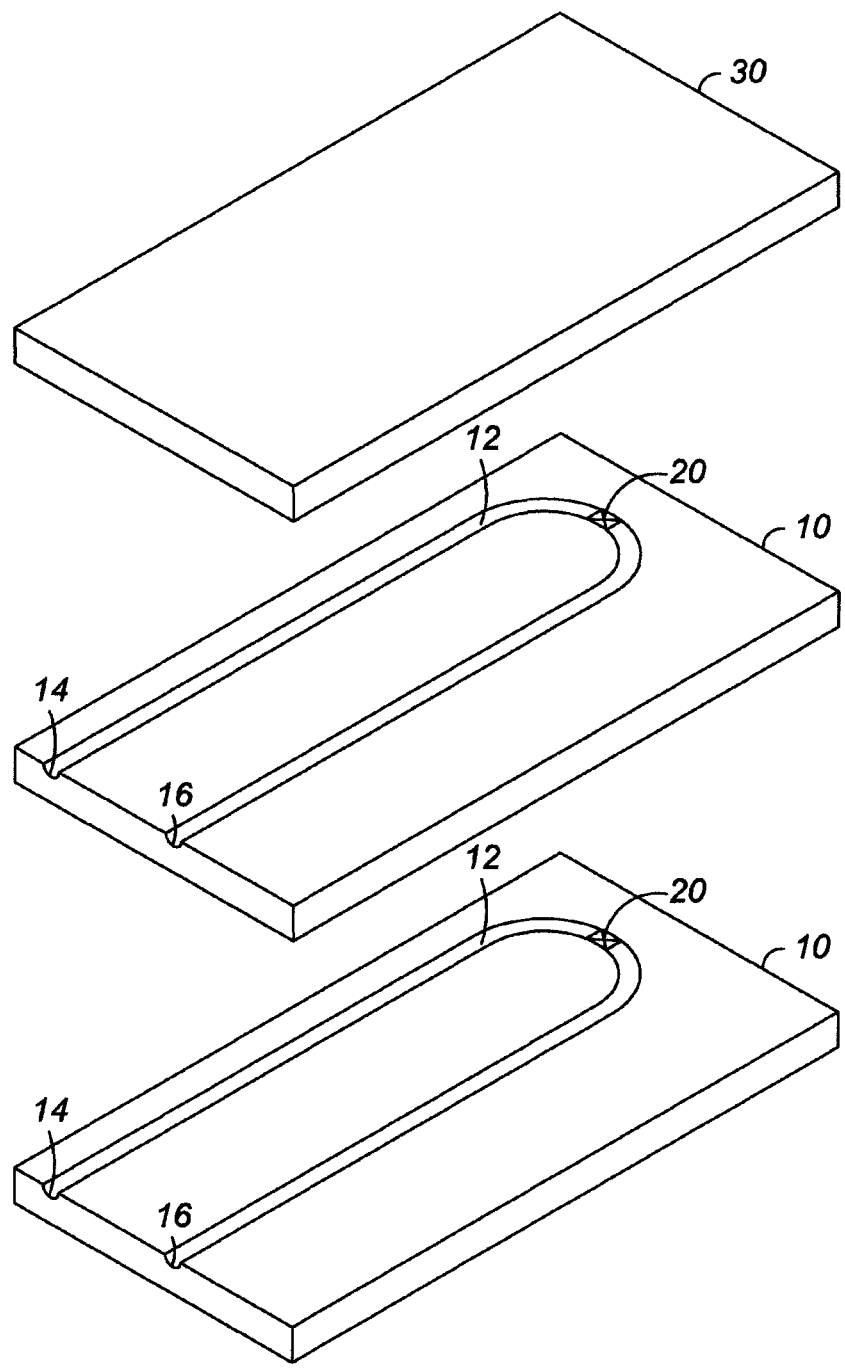
FIG. 3 is a schematic of the heat exchanger for self-cooling a fluid or for use as a heat sink design.

In one embodiment, the heat exchanger can be used to provide a self-cooling heat sink, where the heat exchanger is cooled and provides conductive heat transfer through its external surfaces, for the cooling of items such as electrical, or electronic, equipment, or external surfaces of reactors. In this embodiment, the exchanger, as shown in FIG. 3, comprises at least one plate 10 wherein a first channel 12 is defined, and a cover plate. The channel 12 has an inlet 14 and an outlet 16, and has three sections: a first section, a second section, and a third section, with an expansion device 20 disposed within the second section. A coolant, or refrigerant, is passed into the channel 12 through the inlet 14, expanded through the expansion device 20, thereby generating a cooled refrigerant. The refrigerant then passes through the third section of the channel 12, cools the heat exchanger, and passes out of the channel 12 through the outlet 16. A plurality of the plates 10 can be stacked and bonded together to form a single device which presents a flat cooling surface for contact cooling. The heat exchanger can include a manifold having a manifold inlet channel in fluid communication with the inlets 12, and for delivering the coolant to the heat exchanger. The manifold has a manifold outlet channel in fluid communication with the outlets 16 and collects the expanded coolant. In an alternate embodiment of the multiple first plate embodiment, the heat exchanger can include a second channel in the first plate 10 for carrying a fluid to be cooled. Alternatively, there can be separate manifolds for each plurality of first channel inlets 14, each plurality of first channel outlets 16, each plurality of second channel inlets 24, and each plurality of second channel outlets 26. The separate manifolds provide flexibility and convenience for differing designs.

In an alternate embodiment, the design includes at least one first plate and at least one second plate. The first plate includes a first channel defined therein for carrying the coolant. The second plate includes a continuation of the first channel defined therein from the first plate, with an expansion device disposed within the first channel. The coolant then enters the first channel in the first plate, and is expanded and flows through the first channel in the second plate. The first channel in the second plate can follow a substantially parallel path to the first channel in the first plate providing self-cooling of the fluid, and the expansion device can be positioned in the first plate, the second plate, or at the juncture where the coolant flows from the first plate to the second plate. In addition, the second plate can include a second channel defined therein. The second channel can carry a fluid to be cooled. This variation provides for flexibility of design for manufacturing convenience.

Figure 4:
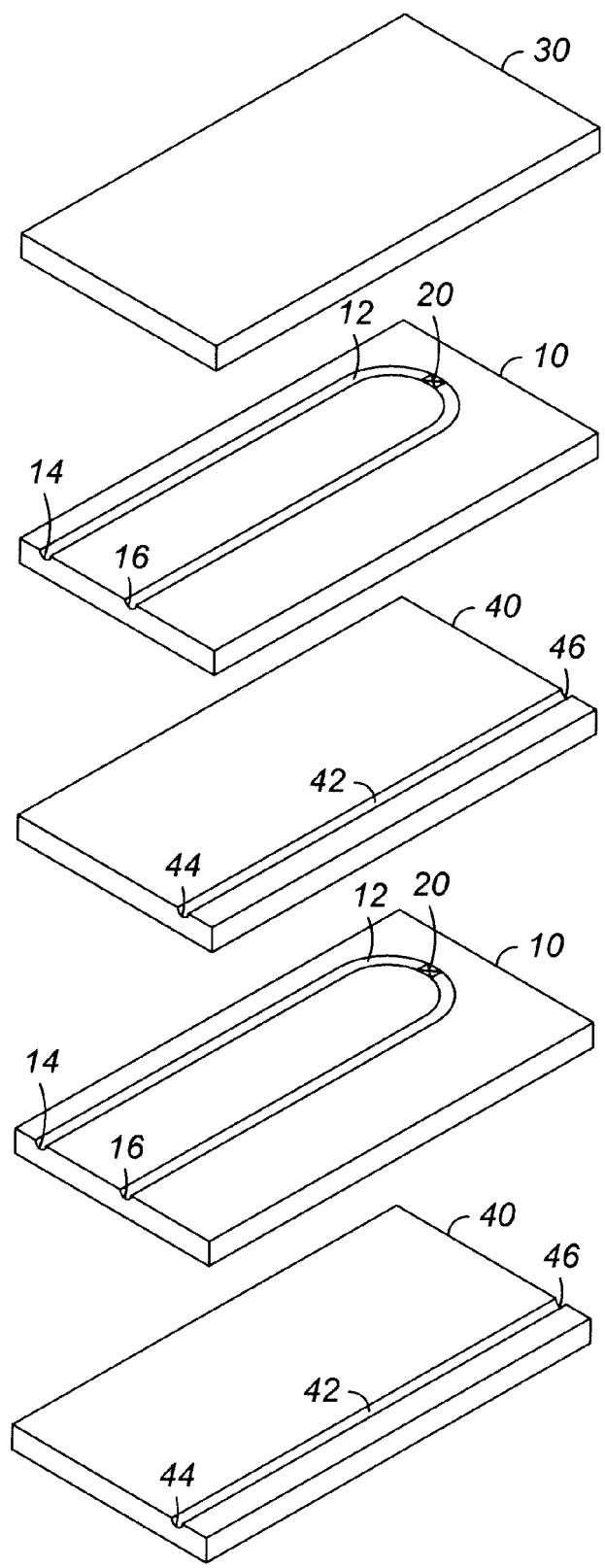
FIG. 4 is a schematic of the heat exchanger wherein the cooled fluid passes through a separate plate from the cooling fluid.

One embodiment provides for at least one second plate 40, as shown in FIG. 4. The heat exchanger includes at least one first plate 10 as described above, having a first channel 12 defined therein and an expansion device 20 disposed within the first channel 12. The second plate 40 has a second channel 42 defined therein, and having an inlet 44 and an outlet 46. The first 10 and second 40 plates are arranged in an alternating sequence to form a stack of first plate 10, second plate 40, first plate 10, second plate 40, etc., and the plates are bonded together with a cover plate 30 to form a single unit. The heat exchanger can include a manifold having a first inlet channel in fluid communication with the plurality of first channel inlets 14, a first outlet channel in fluid communication with the plurality of first channel outlets 16, a second inlet channel in fluid communication with the plurality of second channel inlets 44, and a second outlet channel in fluid communication with the plurality of second channel outlets 46.

The design and arrangement of the channels 12, 42, as with the other embodiments can be chosen to maximize heat transfer area between channels. This includes channels having a sinuous path, or other path design. Variations can include multiple manifolds for the distribution and collection of the coolant and fluid to be cooled.

Several embodiments have been described and it is not intended that the invention be limited to those described, but that the invention is intended to cover variations in channel paths, channel designs, and other features that provide increased heat transfer area, and optimization of heat transfer between a cooling fluid channel and a fluid to be cooled channel.

While the invention has been described with what are presently considered the preferred embodiments, it is to be understood that the invention is not limited to the disclosed embodiments, but it is intended to cover various modifications and equivalent arrangements included within the scope of the appended claims.

The invention claimed is:

1. A heat exchanger comprising:
   at least one plate having a first channel defined therein having an inlet and an outlet, on a first side of the plate and having a first channel portion extending in a first direction from the inlet, a third channel portion extending along the first channel portion and generally parallel thereto toward the outlet, and a second channel portion providing fluid communication between the first channel portion and the third channel portion, and a second channel, which is linear, defined therein having an inlet, on a first side of the plate, and an outlet, on a second side of the plate, opposite the first side of the plate, wherein the first and second channels are in fluid isolation;
   an expansion device disposed within the second channel portion and configured to produce a pressure drop across the expansion device and allow fluid flowing there through to expand sufficiently to generate a two-phase flow so that expanded fluid in the third channel portion provides cooling of fluid in the first channel portion; and
   a cover plate, in fluid communication with the inlet and the outlet of the first channel and the inlet and outlet of the second channel.

2. The heat exchanger of claim 1 comprising:
   a plurality of plates, wherein each plate has a first channel defined therein having an inlet and an outlet, and a second channel defined therein having an inlet and an outlet, wherein the first and second channels are in fluid isolation; and
   an expansion device disposed within the first channel.

3. The heat exchanger of claim 2 wherein the plates are bonded together through diffusion bonding.

4. The heat exchanger of claim 2 wherein the plates are bonded together through brazing of the plates.

5. The heat exchanger of claim 1 wherein the expansion device comprises a restriction in a channel.

6. The heat exchanger of claim 1 wherein the expansion device comprises a micro-turbine disposed within a channel.

7. The heat exchanger of claim 1 wherein the expansion device comprises a Joule-Thomson valve in a channel.

8. The heat exchanger of claim 2 wherein the cover plate has a first channel inlet port in fluid communication with each first channel inlet, a first channel outlet port in fluid communication with the each first channel outlet, a second channel inlet port in fluid communication with each second channel inlet and a second channel outlet port in fluid communication with each second channel outlet.

9. A heat exchanger comprising:
   at least one plate having a first channel defined therein having an inlet and an outlet, on a first side of the plate and having a first channel portion extending from the inlet, a third channel portion extending along the first channel portion toward the outlet, and a second channel portion between the first channel portion and the third channel portion and configured for facilitating fluid flow along the first channel, and a second channel, which is linear, defined therein having an inlet, on a first side of the plate, and an outlet, on a second side of the plate, opposite the first side of the plate, and generally parallel to the first channel portion and configured for facilitating fluid flow along the second channel generally coplanar with the fluid flow along the first channel, wherein the first and second channels are in fluid isolation;
   an expansion device disposed within the second channel portion, wherein the expansion device provides for sufficient expansion to allow for two phase flow so that expanded fluid in the third channel portion provides cooling of fluid in the first channel portion; and
   a cover plate, in fluid communication with the inlet and the outlet of the first channel and the inlet and outlet of the second channel.

10. The heat exchanger of claim 1, wherein in the third channel portion extends in close proximity to the first channel portion.

11. The heat exchanger of claim 1, wherein the first channel has a generally U-shaped configuration between the first channel inlet and outlet.

12. The heat exchanger of claim 1, wherein the first channel inlet and the first channel outlet are positioned at one end portion of the plate and the first channel portion is configured to pass fluid away from the one end portion of the plate in the direction of an opposite end portion of the plate and the third channel portion is configured to pass fluid away from the opposite end portion of the plate and toward the one end portion of the plate.

* * * * *